United States Patent [19]
Ovshinsky et al.

[11] Patent Number: 5,159,661
[45] Date of Patent: Oct. 27, 1992

[54] VERTICALLY INTERCONNECTED PARALLEL DISTRIBUTED PROCESSOR

[75] Inventors: Stanford R. Ovshinsky, Bloomfield Hills; Guy Wicker, Southfield, both of Mich.

[73] Assignee: Energy Conversion Devices, Inc., Troy, Mich.

[21] Appl. No.: 594,387

[22] Filed: Oct. 5, 1990

[51] Int. Cl.$^5$ ............................................. G11C 13/00
[52] U.S. Cl. ..................................... 395/24; 365/105
[58] Field of Search ................ 364/513, 807; 365/163, 365/105; 395/24

[56] References Cited

U.S. PATENT DOCUMENTS

| | | | |
|---|---|---|---|
| 4,569,120 | 2/1986 | Stacey et al. | 365/105 |
| 4,646,266 | 2/1987 | Ovshinsky et al. | 365/105 |
| 4,679,085 | 7/1987 | Johnson et al. | 365/105 |
| 4,876,668 | 8/1989 | Thakoor et al. | 365/163 |

Primary Examiner—Allen R. MacDonald
Assistant Examiner—George Davis
Attorney, Agent, or Firm—Marvin S. Siskind

[57] ABSTRACT

A parallel distributed processor comprises matrices of unit cells arranged in a stacked configuration. Each unit cell includes a chalcogenide body which may be set and reset to a plurality of values of a given physical property. Interconnections between the unit cells are established via the chalcogenide materials and the pattern and strength of the interconnections is determined by the set values of the chalcogenide. The processor is readily adapted to the construction of neural network computing systems.

33 Claims, 2 Drawing Sheets

VERTICALLY INTERCONNECTED PARALLEL DISTRIBUTED PROCESSOR

FIELD OF THE INVENTION

This invention relates generally to computers and more particularly to parallel distributed processors. More specifically, the invention relates to a multi-layered, vertically interconnected, parallel distributed processor which allows the implementation of neural network computers in which the degree of connectivity between individual neurons thereof may be set and reset over a large dynamic range resulting in a computer having the ability to learn from, and adapt to, various data inputs.

BACKGROUND OF THE INVENTION

Digital data processors operate in a serial, algorithmic mode and are capable of performing complex calculations very accurately and quickly. Such processors are incorporated in serial computers generally referred to as von Neumann type machines and they implement data manipulations in a step-by-step fashion. Many information processing problems can be solved by this approach, particularly those requiring repetitive calculations; however, von Neumann type computers perform inadequately when doing tasks involving pattern recognition, classification or associative learning. A further drawback of von Neumann type computers is presented by the fact that before a problem is amenable to solution, it must be fully understood and reduced to a series of algorithms and the algorithms must be translated into an appropriate language for processing by a particular computer. Construction of an appropriate algorithm for tasks involving interpretation of patterns, particularly dynamically changing patterns such as those encountered in speech recognition, high speed character recognition and interpretation of moving scenery present extremely difficult, if not impossible, tasks.

The brain of even a relatively simple organism represents a data processor operating in a parallel, distributed mode and it is capable of quickly and accurately interpreting a large body of dynamically changing data without the need for input of a complex algorithm. Such operation is even more impressive in view of the fact that signal propagation in the brain occurs at a speed many orders of magnitude lower than the speed of propagation of an electrical signal in a silicon chip. Biological neural systems are characterized by a very high degree of connectivity and signal processing is effected by both the degree and architecture of these connections as well as their ability to be altered and reconfigured by specific stimuli.

Investigations of biological systems have led to the development of neural computing networks also termed "parallel, distributed data processors." Such networks are characterized by the presence of a large number of individual computing elements typically termed "neurons," "unit cells," or "nodes." These individual cells are each interconnected to a plurality of other unit cells in a complex network. Connections between pairs of unit cells may be characterized as weak or strong and also as excitory or inhibitory. By the addition of the appropriate input and output circuitry to one or more neural processors, a neural network computer may be constructed. However, efforts made heretofore to construct neural network computers have led to complex software and have been hampered by inadequate hardware.

Neural network computing systems are trained to perform a particular task, rather than being programmed to execute an algorithm. Training is accomplished by configuring the pattern of connections between individual neurons. Training may be done in a passive mode by simply presetting the pattern, and in some instances the strength, of the connections between individual unit cells so as to elicit a desired response to a particular input. A more sophisticated approach involves a dynamic method wherein the actual output response of the network to a given input signal is correlated with a desired output response to generate a training signal which is then applied to the network to reconfigure the connections. A network of this type is able to "learn" an appropriate response to a given input stimulation. A dynamically trainable system can learn from its mistakes and is capable of a large degree of self-teaching.

While it is generally agreed that the massively parallel non-linear logic of neural network computers will readily adapt them to a wide variety of practical applications involving pattern recognition, speech synthesis and the solving of multi-parameter problems, the actual implementation of neural network information processing systems has been hampered by a lack of appropriate computing hardware. Presently, most investigations into neural network computing systems are carried out by emulating neural network systems on conventional von Neumann type computers. While such simulation allows for testing of particular neural network architectures, the conventional digital computer, operating in a serial manner, inherently presents a bottleneck to the parallel distributed processing approach of neural network systems. In some instances, dedicated computing systems comprised of a plurality of processors arranged in a parallel relationship have been utilized for neural network simulations. While these types of machines do confer some advantages in terms of speed, they do not provide true distributed processing and they still cannot simulate fully a large scale, highly interconnected, reconfigurable array of neurons. Furthermore, they are limited by the interconnect problem associated with increasing numbers of nodes, as will be explained more fully hereinbelow.

It is desirable to fabricate large scale, parallel, distributed data processors which comprise integrated arrays of interconnectable unit cells. The unit cells themselves are generally very simple devices for transferring data from one conductor to another, but the processor must be capable of establishing a complex pattern of interconnections therebetween. Two dimensional structures are not capable of providing a sufficiently large number of nodes to permit massively parallel, highly interconnected networks to be prepared; therefore three-dimensional structures are desired. Furthermore, computing power of the processor is greatly enhanced if the degree of connectivity between individual neurons may be controlled over a large dynamic range.

Heretofore, the art has not been adequate to enable the construction of large three-dimensional processing arrays of this type. If the switching of connections and the control of the degree of connectivity of a parallel distributed processor is implemented through the use of conventional semiconductor circuitry, the complexity of each unit cell increases significantly, thereby limiting the size and number of unit cells in a network. It would clearly be desirable to control the connection between individual unit cells through a simple, reliable circuit element which may be set to a range of values corresponding to different connectivities.

One attempt to provide a configurable neural network is disclosed by Thakoor et al in a Jet Propulsion Laboratory report numbered "JPLD-4166 (1987)" entitled "Content-Addressable High Density Memories Based on Neural Network Models." This approach relies upon an amorphous to crystalline transition first recognized by S. R. Ovshinsky, (see for example, "Reversible Electrical Switching Phenomena in Disordered Structures" *Physical Review Letters* V.21, N20, November 1968). The device of Thakoor et al. comprises a two-dimensional matrix of programmable amorphous silicon resistors interconnecting a series of simple unit cells. Each resistor is initially in a high resistivity state and may be set to a lower resistivity state by an appropriate pulse of current. By appropriately setting the resistors, the network is programmed; however, the resistors are not resettable hence, the system is not capable of being reconfigured or otherwise operating in a dynamic learning mode. Also, the resistors are not settable across a dynamic range of resistances and fine control of the degree of connectivity between interconnected cells is not possible.

Accordingly, it will be appreciated that there is a need for a simple neural network processor wherein the degree of connectivity between the unit cells may be simply and reliably set and reset in a cyclic, i.e. repeatable, mode. A system of this type is capable of a high degree of dynamic learning. It is further desirable that any such processor be adaptable to manufacture by standard device fabrication techniques. It is highly desirable that this network be structured as a large area, vertically interconnected three-dimensional device so as to increase processing density and decrease operational time.

While researchers have looked to the brain for initial inspiration in the development of neural network computing systems, they have continued to blindly rely upon conventional semiconductor structures and materials to implement these systems. Conventional semiconductor devices and materials operate in a volatile mode and are not well suited for neural circuitry. S. R. Ovshinsky has long recognized the fact that particular classes of materials can exhibit a range of physical properties which are analogous to those of biological neural systems. See, for example, "Analog Models for Information Storage and Transmission in Physiological Systems" by Stanford R. and Iris M. Ovshinsky in Mat. Res. Bull. Vol. 5, pp 681–690 (1970).

It has been found that certain materials, particularly chalcogenide,-based or containing, materials may be selectably, reversibly and cyclically set to a number of different values of a variety of physical properties such as electrical, optical, chemical, acoustic, pressure response and magnetic. In accord with the principles of the present invention these materials may be used as the basis for the interconnection of a number of unit cells into a three-dimensional neural network system. Materials of this type confer heretofore unattainable advantages in a neural network system insofar as they allow for ready programming and retraining of systems. Furthermore, these materials may be deposited in thin films over relatively large areas with high degrees of reliability and hence make possible the fabrication of large area, monolithic arrays of stacked unit cells and thereby provide a high density, massively parallel, distributed processing network.

The history of computing can be divided into phases based upon the problems presented by the interconnections of computing systems. The earliest electronic computers employed vacuum tubes and relays and the high failure rate, large power dissipation and bulk of these devices greatly restricted the number of nodes or connection points in these primitive systems. The development of the transistor made possible smaller, more reliable computing system thereby increasing the number of nodes and signal processing capabilities of such later computers. Integrated circuit technology made possible the inclusion of a very large number of transistors on a single chip and this greatly increased both the number of nodes and their degree of connectedness thereby making parallel processing systems possible.

The advent of parallel processing has raised the art to a point where a new barrier of connectivity has arisen which limits further development of such systems. Like the brain, realistic neuronal models should have nodes with unit dimensions on the order of square microns and should have a high degree of complex and reconfigurable interconnectivity. (See: S. R. Ovshinsky and I. M. Ovshinsky), "Analog Models for Information Storage and Transmission in Physiological Systems" Mat. Res. Bull. Vol. 5, pp 681–690 (1970, Pergamon Press)). Intelligence of neuronal systems is proportional to the number of nodes or neurons in the system as well as to the number of interconnections to which each node is a party. Furthermore, the information processing ability of the network is greatly increased if the nodes are interconnected in an analog manner whereby the strength of the interconnections may be varied over a range of values.

Through the present invention, previous problems of interconnectivity are overcome and it is now possible to provide a compact, highly interconnected neural network in which the connectivity between the various nodes may be adjusted and readjusted over a large dynamic range.

The computing systems provided by the present invention are true learning machines, unlike other parallel processors, insofar as they can adapt their connectivity to changing inputs in order to learn and can synthesize a creative output in response to novel stimuli. The systems of the present invention have utility in pattern recognition, adaptive control systems and in a wide variety of problem solving tasks.

These and other advantages of the present invention will be readily apparent from the drawings, discussion and description which follow.

BRIEF DESCRIPTION OF THE INVENTION

There is disclosed herein a parallel processing network comprising parallel distributed processing means in communication with data input means and operative to receive and process a parallel input of data. The processing means includes a three-dimensional array of stacked planes of unit cells aligned in a repetitive, electrically interconnected pattern. Each unit cell includes data input means, data output means and a body of chalcogenide based material selectively and reversibly settable over a range of distinguishable values of a given physical property. The body of chalcogenide material is disposed so as to establish communication between the data input means and the data output means. The parallel distributed processing means further includes means for establishing communication between the data output means of a first one of the unit cells in a first one of the stacked planes and the data input means of a second one of the unit cells in a second one of the stacked planes. Communication between the unit cells is established through the chalcogenide based material of at least one of the unit cells. In a processor of this type, the strength of the connection between the first and second unit cells is determined by the particular value of the physical property to which the chalcogenide based material is set. In particular embodiments, the network further includes means for setting and resetting the body of chalcogenide based material to one of the range of distinguishable values. The chalcogenide based material may be set to distinguishable values of electrical, optical or magnetic properties. The means for setting the chalcogenide may be in electrical communication with the data input means of the unit cell and/or with the data output means of at least one other unit cell. The unit cells may also include an isolation device such as a diode or transistor disposed in an electrical series relationship with the body of chalcogenide based material.

In particular embodiments, the chalcogenide based material may further include carbon, silicon, germanium, tin, lead, phosphorous, arsenic, antimony, oxygen or fluorine.

In yet another embodiment of the present invention, each unit cell includes means for setting and resetting the body of chalcogenide based material and the setting and resetting means of a first unit cell in a first one of the stacked planes is in electrical communication with a second unit cell in a second one of the stacked planes whereby the output signal of each unit cell is determined by data communicated from the data input mean of that cell and by data communicated from the data output means of at least other unit cell.

DETAILED DESCRIPTION OF THE INVENTION

The present invention comprises a vertically interconnected parallel distributed processing array which includes a plurality of stacked matrices of unit cells. Each unit cell is in data transmissive communication with at least one other unit cell in an adjoining plane. Preferably, the unit cells in a given plane are also interconnected to some degree. In this manner, a high degree of connectedness between individual unit cells of the array may be established.

Each of the unit cells includes a body of chalcogenide based material which is reversibly settable and resettable over a range of distinguishable values of a given physical property such as electrical resistance, capacitance, optical transmission, reflectivity and the like. The use of a settable and resettable material permits the establishment of various degrees of connection between individual unit cells.

Figure 1A:
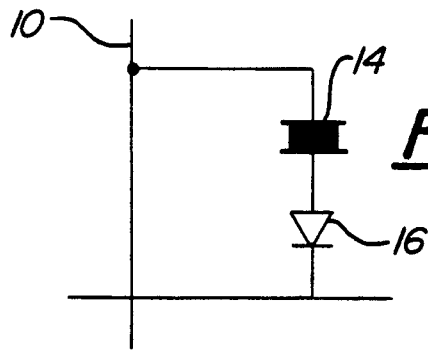
FIG. 1A is a schematic depiction of a unit cell structured in accord with the principals of the present invention.

Referring now to FIG. 1A, there is shown a typical unit cell which may be employed in the present invention. The unit cell includes a data input line 10 and a data output line 12. Communication between the two lines 10,12 is established via a body of chalcogenide based material 14. The unit cell further includes an isolation device, such as a diode 16. Typically, the unit cells are arranged in an array wherein the data input 10 and data output lines 12 comprise a series of rows and columns and in this embodiment an isolation device 16 functions to prevent cross talk between adjacent unit cells. The isolation device is depicted as being a diode 16, and as such may comprise a thin film diode such as a polycrystalline silicon diode although amorphous, polycrystalline or crystalline diodes of various other materials may be similarly employed as may be other devices such as transistors. When structures comprising chalchogenides and polycrystalline diodes are to be fabricated, the diodes are generally deposited as amorphous devices, utilizing thin film technology and they are subsequently crystallized. In accord with the present invention, it has been found advantageous to crystallize the diode material through the use of a short pulse of light from a laser or similar source so as to rapidly crystallize the material without damaging the chalcogenide material.

Figure 1B:
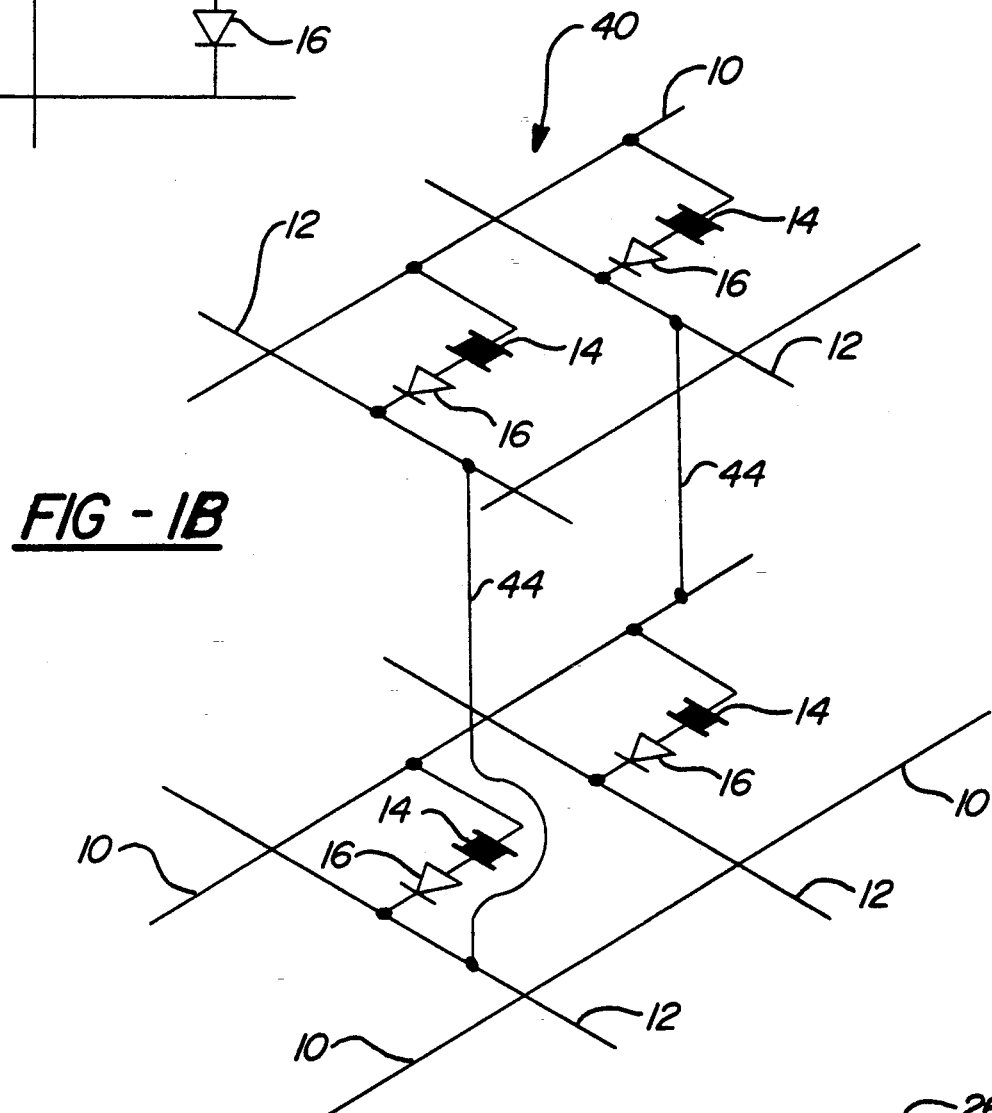
FIG. 1B is a schematic depiction of a portion of two stacked planes of unit cells.

The cell of FIG. 1A is part of a matrix of generally identical cells arranged in rows and columns. The processor of the present invention includes a stacked array of such matrices and at least some of the cells in a first matrix are interconnected with cells in a second matrix so that the data output of the cell in the first plane 40 communicates with the input of the cell in a second plane 42. FIG. 1B depicts, in schematic form, a portion of a stacked array of two matrices 40,42, each including unit cells interconnected by a vertical via 44. Similar stacked matrices are contemplated within the scope of the present invention for the other unit cells shown herein.

Figure 2:
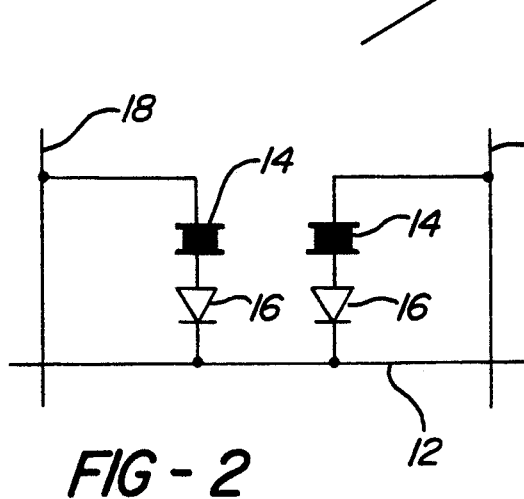
FIG. 2 is a schematic depiction of another embodiment of unit cell structured in accord with the principals of the present invention and including inhibitory and excitory lines.

FIG. 2 depicts a unit cell including an excitory 18 input and inhibitory 20 input and a data output line 12. This embodiment further includes a body of chalcogenide material 14 and an isolation device 16 associated with each of the input lines 18, 20. A unit cell of this type can receive bipolar data which either stimulates or inhibits an output response. In the foregoing unit cells, the body of chalcogenide based material is set and reset by signals applied to the data input lines 10, 18, 20 and the data output lines 12.

Figure 3:
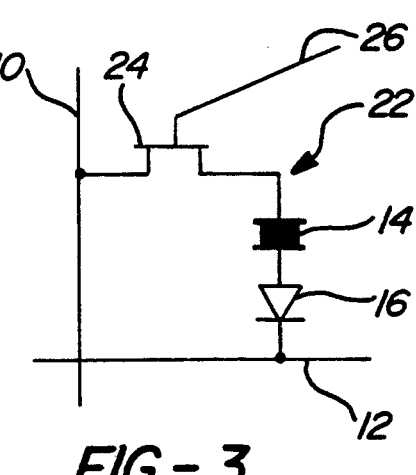
FIG. 3 is a schematic depiction of yet another unit cell structured in accord with the principals of the present invention and including a separate control line.

FIG. 3 depicts yet another embodiment of the present invention which further includes a field effect transistor 22 having the source and drain in series with a data input line 10 and body of chalcogenide material 14. The gate 24 of the transistor is energized by a separate control line 26. In a unit cell of this type, data impressed on the control line 26 can further modify or supplement data on the input line 10 so as to further influence the setting and resetting of the chalcogenide material 14.

Figure 4:
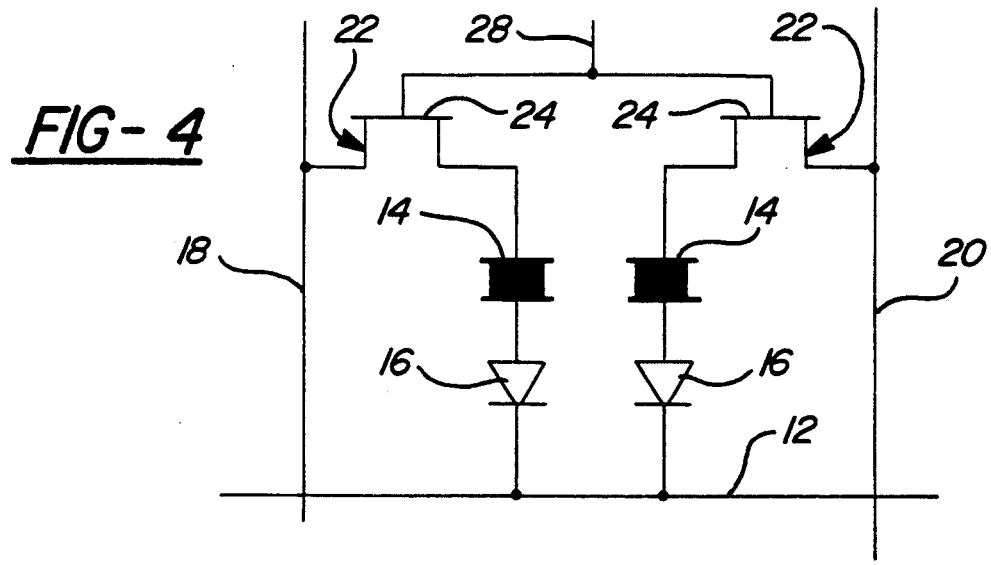
FIG. 4 is a schematic depiction of yet another unit cell of the present invention including excitory and inhibitory lines controlled by a common input line.

Referring now to FIG. 4 there is shown still another embodiment of unit cell. This cell includes excitory 18 and inhibitory lines 20, each having a field effect transistor 22 having the source and drain thereof in series with a body of chalcogenide material 14 and an isolation diode 16. The gates 24 of each of the transistors 22 are controlled by a common control line 28. In the operation of a unit cell of this type, the common control line 28 receives input data, such as data from a pixel of an image sensor and communicates this data to the unit cell. Excitory and inhibitory data on the respective lines 18, 20 modifies the cell's response to this data so as to generate an output which is communicated to other cells in the processing net.

It is to be understood that the foregoing is illustrative of particular unit cell configurations which may be employed in the present invention. Other variations of unit cell may be similarly employed. The present invention encompasses all parallel distributing processing arrays having interconnected unit cells which include a body of settable and resettable chalcogenide based material. The present invention readily lends itself to the fabrication of neural network computing systems as well as various other parallel processing devices.

Figure 5:
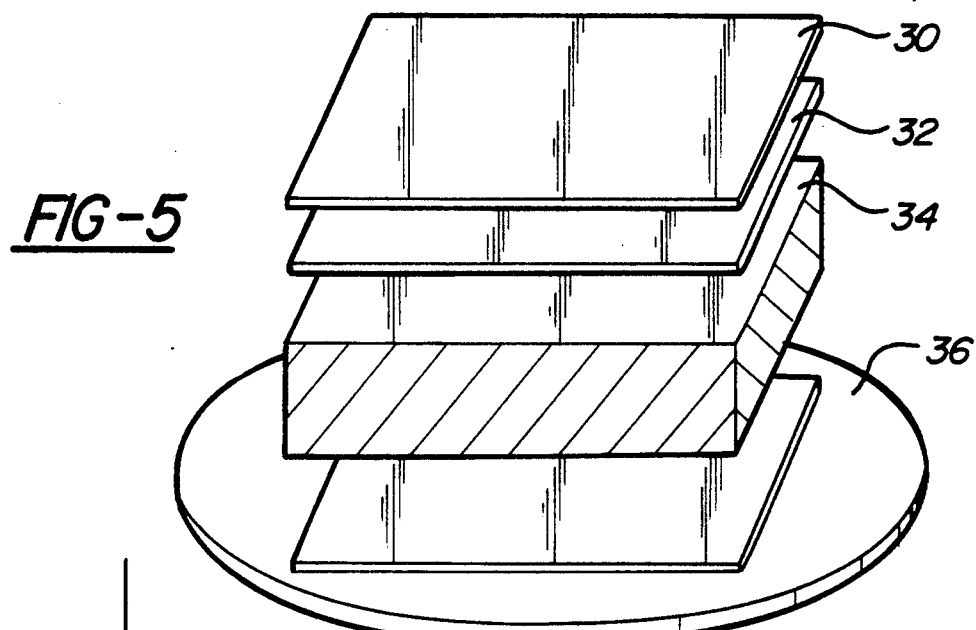
FIG. 5 is a schematic, exploded depiction of a neural network computing device structured in accord with the principals of the present invention and including a vertically interconnected parallel distributed processor therein.

Referring now to FIG. 5, there is shown an exploded view schematically depicting on particular configuration of neural network computer structured in accord with the principals of the present invention. The computing device of FIG. 5 is an integrated computing structure particularly adapted for image sensing and processing. The computing device of FIG. 5 includes a sensor array layer 30 which comprises a matrix of photosensitive elements arrayed in a pixel format. The matrix may be a two-dimensional array, i.e., an n×m array; or, it may be a one-dimensional array, i.e., a 1×n array. The sensor elements may comprise photoresponsive devices such as an amorphous silicon devices or other thin film devices such as cadmium sulfide, cadmium telluride or copper indium diselenide photoresponsive devices. The sensor array 30 is disposed to receive an image thereupon and to generate parallel streams of data corresponding to the various pixels of the image.

In most instances, the computer includes a second layer 32 of amplification circuitry comprised of a matrix of amplifier devices corresponding in number to the photoresponsive elements of the sensor array 30. The amplification layer 32 is operative to amplify the parallel data streams generated by the sensor layer 30. Disposed in electrical communication with the amplifier layer 32 is the vertically interconnected parallel processing network 34 described hereinabove. The processing network 34 is comprised of a number of stacked planes, each plane comprising a matrix of unit cells corresponding generally to the elements of the sensor array. The parallel data streams from the sensor array are amplified and pass to the topmost portion of the parallel processing network 34 and proceed from the individual unit cells in the first plane to one or more unit cells in the second plane and thence onto further planes in the processing network 34. As was described hereinabove, the strength of interconnections between cells in superposed planes are controlled via chalcogenide based elements. The parallel distributing processing network 34 includes a number of stacked planes, each plane comprising a matrix of unit cells. It is to be understood that the number of unit cells in the various planes may be identical or may vary. In some instances, it is desirable to have a unit plane in a stacked relationship with a greater or lesser number of unit cells in an adjoining plane and such variations are contemplated within the scope of the present invention.

The parallel processing network 34 is disposed upon a silicon substrate 36, shown schematically herein as a silicon wafer. The silicon substrate includes the drive circuitry, multiplexing circuitry and interconnect circuitry for establishing communication with the processing network 34. The substrate 36 can further include output contacts or leads, not shown in this illustration. Silicon is a preferred material for the substrate layer since the high speed of crystalline silicon circuitry confers advantages in the operation of the computing device; although it is to be understood that other substrate layers, including layers of semiconductor material having degrees of order ranging from purely amorphous to polycrystalline may be similarly employed.

While the FIG. 5 embodiment depicts the sensor array and amplification layers as being relatively thin planes, it is to be understood that a representation herein is schematic and the sensor array and amplification layer may comprise multiple stacked planes. It is also to be understood that while sensor array has been described in terms of a photosensor, other inputs may be similarly provided. For example, the sensor array 30 may be replaced by a matrix of electrical inputs. Alternatively, various other sensing devices may be employed to input a signal corresponding to acoustic, magnetic, thermal, pressure or chemical inputs. For example, the sensor array 30 may be an array of chemfets. These devices are field effect transistors which respond to particular chemical species. An array thus configured would be well adapted for sensing chemical species and would have great utility in the characterization and classification of odors, detection of bombs, gases or other noxious species as well as the quantification of aromas such as perfumes, wines and foodstuffs.

The chalcogenide based material is employed to establish communication between the input and output mean of each unit cell and hence becomes a critical link in establishing intracellular communication. The chalcogenide material may be set over a range of physical properties be they optical, magnetic or electrical. For example, by an appropriate input of energy the transparency and/or reflectivity of the material may be reversibly set to a plurality of values. Similarly, input of an appropriate signal can change the capacitance, resistivity, or magnetic permeability of these materials to different stable values. In the most preferred embodiment of the present invention, the computing system operates on electrical impulses and the chalcogenide material is set and reset to a plurality of values of electrical resistivity although it is to be understood that in optical computing systems, reflectivity and/or optical transmission may be similarly employed.

Within the context of the present invention, chalcogenide based materials are defined as being any materials which include one or more chalcogenide elements therein and it is generally understood that the chalcogenide elements include the group VIa elements of the periodic table. The chalcogenide based materials of the present invention can also include elements such as carbon, silicon, germanium, tin, lead, phosphorous, arsenic, antimony, fluorine, oxygen or bismuth. One particularly preferred group of chalcogenide materials are those referred to as adaptive memory materials. These materials are reversibly switchable from a highly disordered state to a more ordered state and various degrees of local order or disorder correspond to different values of resistivity or other physical properties.

In a typical adaptive semi-conductor material, the resistance may be altered from a value of about $10^6$ ohms to about $10^2$ ohms by a current pulse of about 1 millisecond duration having an amplitude of 5 milliamps or by an equivalent pulse of light energy or the like. To obtain an intermediate resistance value, intermediate values of current are applied.

Figure 6:
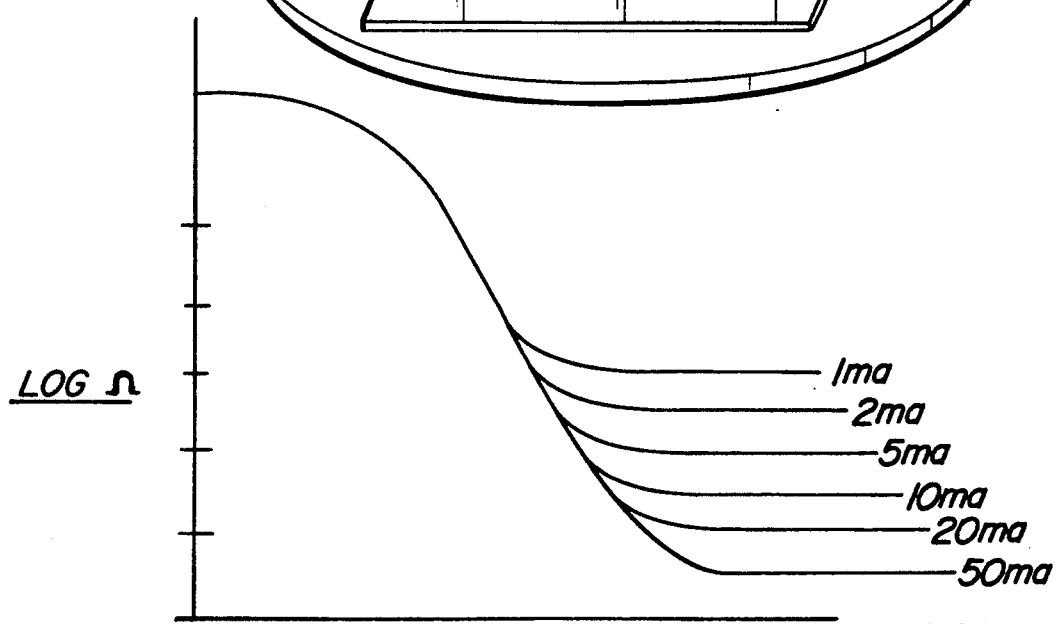
FIG. 6 is a graph depicting the electrical characteristics of a typical adaptive memory material which may be employed in the practice of the present invention.

Referring now to FIG. 6 there is shown a schematic depiction of electrical properties of a typical adaptive memory material. The Figure depicts a plot of the log of the set energy applied to the material versus the log of the electrical resistivity of the material. It will be seen from the curve that the resistance decreases with increasing set energy. It will also be seen that the magnitude of the current flux applied to the material, even under equal energy conditions, determines the final resistance of the material. It will thus be appreciated that this material effectively provides a solid state equivalent of a rheostat. By using an appropriate current pulse, the resistance value of the material may be set to a stable value. By utilizing a material of this type in the processor of the present invention, the degree of connectivity between individual unit cells may be readily set.

There are a number of compositions of chalcogenide based adaptive memory material which may be employed in the practice of the invention. The adaptive memory materials generally contain Group IV and/or VI semi-conductor materials and they further include Group V materials such as phosphorous. When phosphorous is replaced by a high molecular weight Group V elements such as arsenic, antimony, etc. the resistance versus energy curve becomes steeper. Adaptive memory materials are detailed in U.S. Pat. No. 3,530,441 of Ovshinsky, the disclosure of which is incorporated herein by reference. In view of the foregoing it is to be understood that large area parallel distributed processing arrays may be advantageously constructed utilizing adaptive, settable and resettable chalcogenide materials. These arrays have significant utility in the construction of neural network computing systems as well as other data processing applications. The foregoing drawings, discussion, description and examples are merely illustrative of particular embodiments of the present invention. It is to be understood that numerous modifications and variations thereof may be practiced in accord with the principals of the present invention. It is the following claims, including all equivalents, which define the scope of the invention.

We claim:

1. A parallel processing network comprising:
   (A) means for a parallel input of a plurality of data; and
   (B) parallel distributed processing means operative to receive and process said parallel input of said plurality of data, said processing means including:
      (1) a three-dimensional array of stacked planes of a plurality of unit cells; each of said unit cells is a single repetition of a repetitive, three-dimensional electrically interconnected pattern; each unit cell including:
         (a) data input means;
         (b) data output means; and
         (c) a body of chalcogenide based material which is characterized by the capability of being selectively and reversibly set to any particular distinguishable value within a range of distinguishable values of a given physical property, said body of chalcogenide material disposed so as to establish communication between said data input means and said data output means; and
      (2) means for establishing communication between the data output means of a first one of said unit cells in a first one of said stacked planes and the data input means of a second one of said unit cells in a second one of said stacked planes, said communication occurring through the body of chalcogenide based material of at least one of said unit cells, whereby the strength of the connection between said first and second unit cells is determined by the particular distinguishable value, within said range of distinguishable values of said physical property, to which the body of chalcogenide material, through which said communication occurs, is set.

2. A network as in claim 1, further comprising means for setting and resetting said body of chalcogenide based material to one of said range of distinguishable values.

3. A network as in claim 2, wherein said means for setting and resetting comprises means for applying an electrical signal to said body of chalcogenide based material.

4. A network as in claim 3, wherein said means for applying an electrical signal to said body of chalcogenide based material is in electrical communication with the data input means of the unit cell.

5. A network as in claim 3, wherein said means for applying an electrical signal to said body of chalcogenide based material is in electrical communication with the data output means of at least one other unit cell.

6. A network as in claim 2, wherein said means for setting and resetting said body of chalcogenide based material includes a field effect transistor.

7. A network as in claim 6, wherein the gate of said field effect transistor is in electrical communication with the data output means of at least one other unit cell.

8. A network as in claim 1, wherein each unit cell further includes isolation means disposed in series with said body of chalcogenide based material.

9. A network as in claim 8, wherein said isolation means comprises a transistor.

10. A network as in claim 9, wherein said transistor is a field effect transistor.

11. A network as in claim 8, wherein said isolation device is a diode.

12. A network as in claim 11, wherein said diode is a polycrystalline silicon diode.

13. A network as in claim 11, wherein said diode is a microcrystalline diode.

14. A network as in claim 1, wherein said means for the parallel input of a plurality of data comprises means for the parallel input of electrical data.

15. A network as in claim 1, wherein the means for the parallel input of a plurality of data comprises means for the parallel input of optical data.

16. A network as in claim 15, wherein the means for the parallel input of optical data further includes means for converting optical data to electrical data.

17. A network as in claim 16, wherein said means for converting optical data to electrical data includes a photoresponsive body of silicon alloy material.

18. A network as in claim 1, wherein said means for the parallel input of data further includes means for sensing a preselected chemical species and generating an electrical signal in response thereto.

19. A network as in claim 1, wherein said body of chalcogenide based material is selectively and reversibly settable over a range of values of electrical resistivity.

20. A network as in claim 1, wherein the body of chalcogenide based material is selectively and reversibly settable over a range of values of an optical property.

21. A network as in claim 1, wherein said body of chalcogenide based material is selectively and reversibly settable over a range of values of electrical capacitance.

22. A network as in claim 1, wherein said body of chalcogenide based material is selectively and reversibly settable over a range of values of a magnetic property.

23. A network as in claim 1, wherein said chalcogenide based body further includes carbon.

24. A network as in claim 1, wherein said chalcogenide based body further includes silicon.

25. A network as in claim 1, wherein said chalcogenide based body further includes germanium.

26. A network as in claim 1, wherein said chalcogenide based body further includes tin.

27. A network as in claim 1, wherein said chalcogenide based body further includes lead.

28. A network as in claim 1, wherein said chalcogenide based body further includes phosphorus.

29. A network as in claim 1, wherein said chalcogenide based body further includes arsenic.

30. A network as in claim 1, wherein said chalcogenide based body further includes antimony.

31. A network as in claim 1, wherein said chalcogenide based body further includes fluorine.

32. A network as in claim 1, wherein said chalcogenide based body further includes bismuth.

33. A network as in claim 1, wherein said data input means is an excitory data input means and wherein said each unit cell further includes second data input means for the input of inhibitory data and a second body of chalcogenide based material selectively and reversibly settable over a range of distinguishable valves of a given physical property, disposed so as to establish communication between said second data input means and said data output means.

* * * * *